United States Patent
Honma et al.

(10) Patent No.: US 10,073,341 B2
(45) Date of Patent: Sep. 11, 2018

(54) ADHESION LAYER COMPOSITION, METHOD FOR FORMING FILM BY NANOIMPRINTING, METHODS FOR MANUFACTURING OPTICAL COMPONENT, CIRCUIT BOARD AND ELECTRONIC APPARATUS

(71) Applicant: CANON KABUSHIKI KAISHA, Tokyo (JP)

(72) Inventors: Takeshi Honma, Tokyo (JP); Toshiki Ito, Kawasaki (JP); Tomonori Otani, Kawasaki (JP); Kazumi Iwashita, Kobe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/323,939

(22) PCT Filed: Jun. 26, 2015

(86) PCT No.: PCT/JP2015/003227
§ 371 (c)(1),
(2) Date: Jan. 4, 2017

(87) PCT Pub. No.: WO2016/006190
PCT Pub. Date: Jan. 14, 2016

(65) Prior Publication Data
US 2017/0184959 A1 Jun. 29, 2017

(30) Foreign Application Priority Data
Jul. 8, 2014 (JP) ................. 2014-140907

(51) Int. Cl.
*B32B 3/00* (2006.01)
*G03F 7/00* (2006.01)
(Continued)

(52) U.S. Cl.
CPC ........ *G03F 7/0002* (2013.01); *B29C 35/0805* (2013.01); *B32B 3/30* (2013.01);
(Continued)

(58) Field of Classification Search
CPC ...... G03F 7/0002; B29C 35/0805; C09J 4/06; C09J 5/06; B32B 3/30; B32B 7/12;
(Continued)

(56) References Cited

U.S. PATENT DOCUMENTS

2006/0210819 A1 9/2006 Dueber
2007/0212494 A1 9/2007 Xu
(Continued)

FOREIGN PATENT DOCUMENTS

JP S55125631 A 9/1980
JP H10-069093 A 3/1998
(Continued)

OTHER PUBLICATIONS

Erik C. Hagberg et al., "Effects of Modulus and Surface Chemistry of Thiol-Ene Photopolymers in Nanoimprinting", Nano Letters, 2007, pp. 233-237, vol. 7, No. 2.

*Primary Examiner* — Elizabeth Evans Mulvaney
(74) *Attorney, Agent, or Firm* — Canon U.S.A. Inc., IP Division

(57) ABSTRACT

In nanoimprinting processes, photo-cured products often separate from the substrate and stick to the mold due to insufficient adhesion between the photo-cured product and the substrate. This causes a defect of pattern separation.
An adhesion layer composition used for forming an adhesion layer between a substrate and a photocurable composition includes a compound (A) having at least two functional groups, and a solvent (B). The functional groups include at least one functional group capable of being bound to the substrate, selected from the group consisting of hydroxy, carboxy, thiol, amino, epoxy, and (blocked) isocyanate, and at least one hydrogen donating group as a functional group capable of being bound to the photocurable composition.

21 Claims, 1 Drawing Sheet

STEP (6)

(51) Int. Cl.

| | |
|---|---|
| *B32B 3/30* | (2006.01) |
| *B32B 7/12* | (2006.01) |
| *B32B 27/30* | (2006.01) |
| *B32B 27/16* | (2006.01) |
| *B29C 35/08* | (2006.01) |
| *H01L 21/027* | (2006.01) |
| *H01L 21/308* | (2006.01) |
| *H01L 21/266* | (2006.01) |
| *C09J 5/06* | (2006.01) |
| *C09J 4/06* | (2006.01) |
| *G02B 1/04* | (2006.01) |
| *B29K 33/00* | (2006.01) |
| *B29K 105/00* | (2006.01) |

(52) U.S. Cl.
CPC ............... *B32B 7/12* (2013.01); *B32B 27/16* (2013.01); *B32B 27/308* (2013.01); *C09J 4/06* (2013.01); *C09J 5/06* (2013.01); *G02B 1/04* (2013.01); *H01L 21/0271* (2013.01); *H01L 21/266* (2013.01); *H01L 21/308* (2013.01); *B29C 2035/0827* (2013.01); *B29K 2033/08* (2013.01); *B29K 2105/0002* (2013.01); *B32B 2255/26* (2013.01); *B32B 2457/08* (2013.01); *B32B 2551/00* (2013.01)

(58) Field of Classification Search
CPC ..... B32B 27/16; B32B 27/308; H01L 21/266; H01L 21/0271; H01L 21/3081
See application file for complete search history.

(56) References Cited

U.S. PATENT DOCUMENTS

| | | | |
|---|---|---|---|
| 2012/0199997 | A1 | 8/2012 | Tanabe et al. |
| 2012/0292082 | A1 | 11/2012 | Miyauchi |
| 2013/0126472 | A1 | 5/2013 | Suzuki |
| 2013/0270741 | A1 | 10/2013 | Ookawa |
| 2014/0020932 | A1 | 1/2014 | Minami |

FOREIGN PATENT DOCUMENTS

| | | |
|---|---|---|
| JP | 2010073811 A | 4/2010 |
| JP | 2012-078602 A | 4/2012 |
| JP | 2012-164785 A | 8/2012 |
| JP | 2013153084 A | 8/2013 |
| JP | 2014-003123 A | 1/2014 |
| WO | 2007119714 A1 | 10/2007 |
| WO | 2013/047435 A1 | 4/2013 |
| WO | 2013191118 A1 | 12/2013 |

FIG. 1A STEP (1) 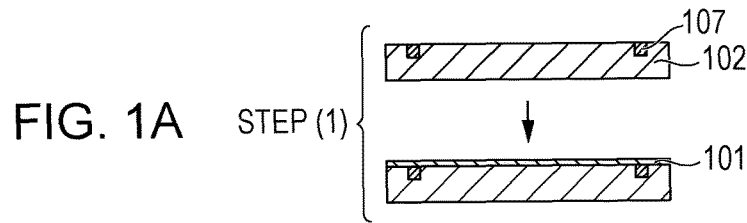
FIG. 1B STEP (2) 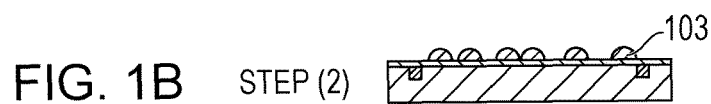
FIG. 1C STEP (3) 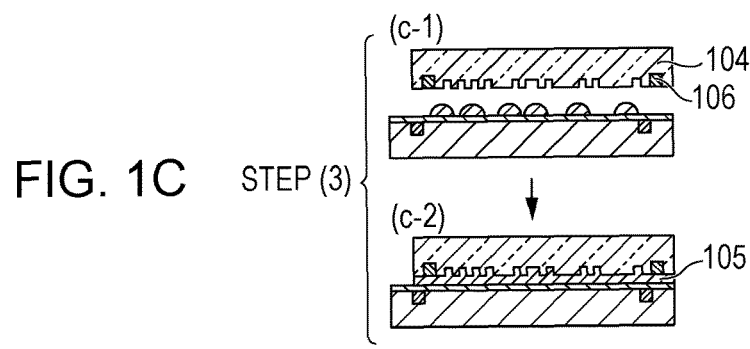
FIG. 1D STEP (4) 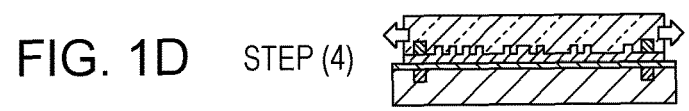
FIG. 1E STEP (5) 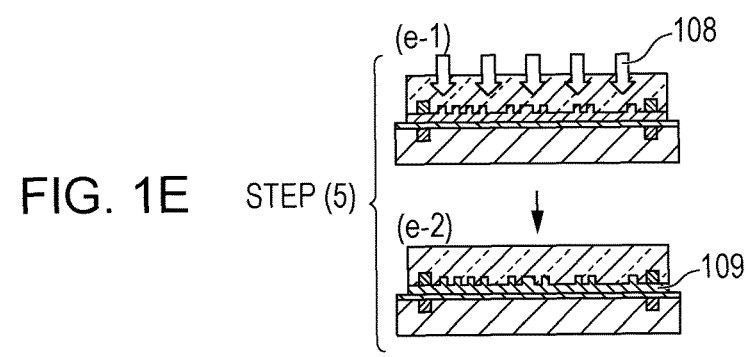
FIG. 1F STEP (6) 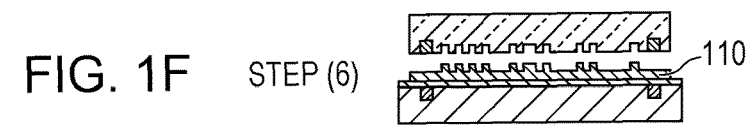
FIG. 1G STEP (7) 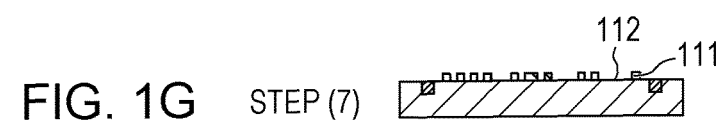
FIG. 1H STEP (8) 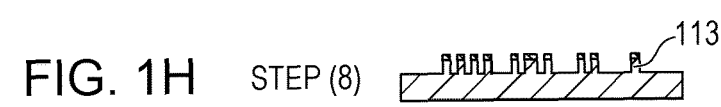

ADHESION LAYER COMPOSITION, METHOD FOR FORMING FILM BY NANOIMPRINTING, METHODS FOR MANUFACTURING OPTICAL COMPONENT, CIRCUIT BOARD AND ELECTRONIC APPARATUS

CROSS-REFERENCE TO RELATED APPLICATIONS

This application is a National Stage filing of International Application No. PCT/JP2015/003227 filed Jun. 26, 2015, which claims the benefit of Japanese Patent Application No. 2014-140907, filed Jul. 8, 2014, the disclosures of each of which are hereby incorporated by reference herein in their entirety.

TECHNICAL FIELD

The present invention relates to an adhesion layer composition, a method for forming a film by nanoimprinting, methods for manufacturing an optical component, a circuit board and an electronic apparatus.

BACKGROUND ART

In the field of semiconductor devices and microelectromechanical systems (MEMS), miniaturization is increasingly demanded. Accordingly, microfabrication techniques have recently attracted attention which uses a resist (photocurable composition) pattern having a specific shape on a substrate (wafer) as a mold, in addition to conventional photolithography techniques. The microfabrication technique, which is also called photo-nanoimprinting technique, enables the formation of fine structures of the order of several nanometers on the substrate (for example, PTL 1). In a photo-printing technique, first, a resist is applied to the region on a substrate to which a pattern will be formed (application step). Subsequently, the resist is formed into a pattern in a mold (mold contact step). Then, the resist is cured by being irradiated with light (irradiation step), and separated from the mold (mold-releasing step). Through these steps, a resin pattern (photo-cured product) having a specific shape is formed on the substrate. In addition, by repeating the sequence of the above steps for other regions on the substrate, a fine structure is formed over the entire surface of the substrate.

Unfortunately, the adhesion between the photo-cured product formed by curing a photocurable composition with light and the substrate is insufficient in some cases. The photo-cured product is therefore separated from the substrate and sticks to the mold when the mold is removed from the photo-cured product in the mold-releasing step of a photo-nanoimprinting process, and results in a defect of pattern separation.

To deal with this issue, a technique is devised for increasing the adhesion between the photocurable composition and the substrate by forming an adhesion layer between the photocurable composition and the substrate (PTL 2).

In PTL 2, an adhesion layer is formed of a composition containing a compound having a reactive functional group bound to a heterocyclic ring containing nitrogen and an unsaturated bond and capable of forming chemical bonds with a thiol group and an organic compound. Even in the case of using a composition containing such a compound, however, the adhesion between the photocurable composition and the substrate is not sufficiently increased in some cases, and pattern separation resulting in a defect can occur.

CITATION LIST

Patent Literature

PTL 1: Japanese Patent Laid-Open No. 2010-073811
PTL 2: Japanese Patent Laid-Open No. 2013-153084

SUMMARY OF INVENTION

The present invention provides an adhesion layer composition enabling a photocurable composition to adhere firmly to a substrate, and preventing defects resulting from pattern separation.

According to an embodiment of the present invention, an adhesion layer composition is provided which is used for forming an adhesion layer between a substrate and a photocurable composition. The adhesion layer composition contains a compound (A) having at least two binding functional groups, and a solvent (B). The binding functional groups include at least one functional group capable of being bound to the substrate and at least one functional group capable of being bound to the photocurable composition. The functional group capable of being bound to the substrate is selected from the group consisting of hydroxy, carboxy, thiol, amino, epoxy, and (blocked) isocyanate, and the functional group capable of being bound to the photocurable composition is a hydrogen donating functional group.

The adhesion layer composition of an embodiment of the present invention binds a photocurable composition to a substrate in a photo-nanoimprinting process. In addition, a photo-nanoimprinting method using the adhesion layer composition enables the formation of a photo-cured product pattern without defects of pattern separation and thus leads to optical components, circuit boards and electronic apparatuses including less defective patterns.

Further features of the present invention will become apparent from the following description of exemplary embodiments with reference to the attached drawings.

BRIEF DESCRIPTION OF DRAWINGS

FIG. 1A is a sectional view illustrating a step of methods for forming a photo-cured product pattern and for manufacturing an optical component, a circuit board and an electronic apparatus.

FIG. 1B is a sectional view illustrating a step of the methods for forming a patterned film and for manufacturing an optical component, a circuit board and an electronic apparatus.

FIG. 1C is a sectional view illustrating a step of the methods for forming a patterned film and for manufacturing an optical component, a circuit board and an electronic apparatus.

FIG. 1D is a sectional view illustrating a step of the methods for forming a patterned film and for manufacturing an optical component, a circuit board and an electronic apparatus.

FIG. 1E is a sectional view illustrating a step of the methods for forming a patterned film and for manufacturing an optical component, a circuit board and an electronic apparatus.

FIG. 1F is a sectional view illustrating a step of the methods for forming a patterned film and for manufacturing an optical component, a circuit board and an electronic apparatus.

FIG. 1G is a sectional view illustrating a step of the methods for forming a patterned film and for manufacturing an optical component, a circuit board and an electronic apparatus.

FIG. 1H is a sectional view illustrating a step of the methods for forming a patterned film and for manufacturing an optical component, a circuit board and an electronic apparatus.

DESCRIPTION OF EMBODIMENTS

Embodiments of the present invention will now be described in detail. The present invention is not limited to the following embodiments and includes any modification or change that can be made within the scope and spirit of the invention on the basis of the knowledge of those skilled in the art.

The adhesion layer composition according to an embodiment of the present invention is intended for an adhesion layer formed between a substrate and a photocurable composition. The adhesion layer composition contains a compound (A) having at least two binding functional groups, and a solvent (B). The binding functional groups include at least one functional group directly bound to a hydrocarbon or an aromatic hydrocarbon and capable of being bound to the substrate, and at least one functional group directly bound to a hydrocarbon or an aromatic hydrocarbon and capable of being bound to the photocurable composition. The functional group capable of being bound to the substrate is at least one selected from the group consisting of hydroxy, carboxy, thiol, amino, epoxy, and (blocked) isocyanate, and the functional group capable of being bound to the photocurable composition is a hydrogen donating functional group.

The composition of the present invention is useful as an adhesion layer composition used for imprinting, particularly for photo-nanoimprinting.

The constituents of the composition will now be described in detail.

Compound (A) 1

The composition (A) contains at least one functional group capable of being bound to the substrate, and at least one functional group capable of being bound to the photocurable composition.

The phrase "functional group capable of being bound to" is a functional group that can form a chemical bond such as covalent bond, an ionic bond, a hydrogen bond, or a bond by intermolecular force.

The compound (A) has a functional group capable of being bound to the substrate. This functional group is directly bound to a hydrocarbon or an aromatic hydrocarbon and is selected from the group consisting of hydroxyl, carboxy, thiol, amino, epoxy, isocyanate, and (blocked) isocyanate.

The compound (A) also has a functional group capable of being bound to the photocurable composition. This functional group is a hydrogen donating group bound to a hydrocarbon or an aromatic hydrocarbon. An advantageous hydrogen donating functional group may be, but not limited to, a functional group that can easily form a covalent bond with the photocurable composition. Examples of such a hydrogen donating functional group include thiol, alkylamino, and hydroxy. Thiol and alkylamino groups are more likely to form a covalent bond with the photocurable composition and are therefore more advantageous.

Since the compound disclosed in PTL 2 contains a reactive binding group and a thiol group that are directly bound to a heterocyclic ring containing nitrogen and an unsaturated bond, the heterocyclic ring absorbs light when the compound is used in a photo-nanoimprinting process. The reason of this is not clear, but it is though that light absorption reduces the adhesion. In the case of the compound (A) of the present embodiment, on the other hand, the binding functional groups are directly bound to the hydrocarbon or aromatic hydrocarbon of the compound. It is believed that this structure produces satisfactory adhesion in photo-nanoimprinting processes.

In the compound (A), the functional group capable of being bound to the substrate and the functional group capable of being bound to the photocurable composition may be the same or different.

The term "(blocked) isocyanate" mentioned herein refers to an isocyanate group or a blocked isocyanate group. (Alkyl)amino group refers to the amino group or an alkyl amino group, and (meth)acrylic compound may be an acrylic compound or a methacrylic compound.

Advantageously, the compound (A) has a plurality of functional groups capable of being bound to the substrate and/or a plurality of functional groups capable of being bound to the photocurable composition. The presence of a plurality of these functional groups increases the adhesion to the substrate and the photocurable composition. The number of the functional groups may be two or more, such as three or more, and preferably four or more.

Desirably, the compound (A) does not have a heterocyclic structure. The compound (A) not having a heterocyclic structure is expected to prevent adhesion decrease resulting from UV absorption.

Advantageously, the compound (A) has straight chains extending in four directions, and the functional groups capable of being bound to the substrate or the photocurable composition are bound to each end of the straight chains. When the binding functional groups are bound to each end of the four straight chains, the substrate and the photocurable composition can be efficiently bound to each other. Thus, satisfactory adhesion can be produced.

The compound (A) forms a chemical bond, such as a covalent bond, an ionic bond, a hydrogen bond or a bond by intermolecular force, with a functional group present at the surface of the substrate in a heating step in the process for forming an adhesion layer described later. Then, an irradiation step, described later, causes a chain transfer reaction between the compound (A) and radicals produced in the photocurable composition, thus forming a covalent bond between the compound (A) and a polymerizable compound in the photocurable composition. This is probably the reason why the adhesion between the substrate and the photocurable composition increases.

Examples of the compound (A) having a thiol group include, but are not limited to, bifunctional thiol compounds, such as 1,6-hexanedithiol, 1,8-octanedithiol, 1,10-decanedithiol, 1,4-butanediol bis(thioglycolate), and 1,4-bis(3-mercaptobutyryloxy)butane; trifunctional thiol compounds, such as 1,3,5-tris(3-mercaptobutyryloxyethyl)-1,3,5-triazine-2,4,6(1H,3H,5H)-trione, trimethylolpropane tris(3-mercaptopropionate), pentaerythritol tris(3-mercapto butyrate); and tetrafunctional thiol compounds having four or more thiol groups at the center of the molecule, such as pentaerythritol tetrakis(mercaptoacetate), pentaerythritol tetrakis(3-mercaptobutyrate), and pentaerythritol tetrakis(3-mercaptopropionate).

Examples of the compound (A) having an (alkyl)amino group include, but are not limited to, carboxy group-containing amine compounds, such as N-phenylglycine, 1,6- diaminohexane-N,N,N',N'-tetraacetic acid, diethylenetriamine pentaacetic acid, and diethylenetriamine pentaacetic acid dianhydride; hydroxy group-containing amine compounds, such as N,N,N',N'-tetrakis(2-hydroxyethyl)ethylenediamine, N,N,N',N'-tetrakis(2-hydroxypropyl)ethylenediamine, and N,N,N',N'',N''-pentakis(2-hydroxypropyl)diethylenetriamine; and polyfunctional amine compounds, such as N,N,N'',N''-tetraisopropyldiethylenetriamine, and N,N,N'',N''-tetrabutyldiethylenetriamine.

The compound (A) may be a single compound or a combination of a plurality of compounds.

The content of the compound (A) in the adhesion layer composition can be appropriately adjusted depending on the viscosity of the composition and the thickness of the adhesion layer, and the advantageous content thereof is in the range of 0.01% to 10% by weight, such as 0.1% to 7% by weight.

Solvent (B)

Any solvent may be used as the solvent (B) used in the adhesion layer composition, as long as it can dissolve the compound (A). Desirably, the solvent (B) has a boiling point in the range of 80° C. to 200° C. under normal pressure. More desirably, the solvent (B) has at least one structure of an ester structure, a ketone structure, a hydroxy group, and an ether structure. These structures increase the solubility of the compound (A) and the wettability thereof on the substrate. Examples of solvent (B) include propylene glycol monomethyl ether acetate, propylene glycol monomethyl ether, cyclohexanone, 2-heptanone, γ-butyrolactone, and ethyl lactate. These may be used singly or in combination. From the viewpoint of easily applying the composition, propylene glycol monomethyl ether acetate or a mixed solvent thereof is advantageous.

The content of the solvent (B) in the adhesion layer composition can be appropriately adjusted depending on, for example, the viscosity of the compound (A), easy coating, and the thickness of the adhesion layer, and the advantageous content thereof is 70% by mass or more relative to the total mass of the composition. More advantageously, the content of the solvent (B) is 90% by mass or more, such as 95% by mass or more. If the content of the solvent (B) is less than 70% by mass, the composition might not have satisfactory characteristics in being applied.

Other Additives (C)

The adhesion layer composition may further contain additives (C) in addition to the compound (A) and solvent (B), according to the use thereof within a range in which the intended effects of the present invention are produced. Such additives include a surfactant, a crosslinking agent, a polymer component, an antioxidant, and a polymerization inhibitor.

Viscosity of Adhesion Layer Composition

The viscosity of the adhesion layer composition at 23° C. depends on the compound (A) and the solvent (B), and is desirably in the range of 0.5 mPa·s to 20 mPa·s, more desirably in the range of 1 mPa·s to 10 mPa·s, such as in the range of 1 mPa·s to 5 mPa·s.

The adhesion layer composition having a viscosity of 20 mPa·s or less can be easily applied and facilitates the control of the thickness of the coating thereof.

Impurities in Adhesion Layer Composition

Desirably, the adhesion layer composition contains as little impurities as possible. The impurities mentioned herein refer to constituents other than the compound (A), the solvent (B) and the additives (C).

It is therefore desirable that the adhesion layer composition have been purified. For example, the adhesion layer composition may be filtered for purification.

In this instance, more specifically, the mixture of the compound (A) and the solvent (B) and, optionally, other additives (C) may be filtered through a filter having a pore size in the range of 0.001 μm to 5.0 μm. This filtration may be performed in a plurality of steps or repeated several times. The filtrate may be further filtered. A plurality of filters having different pore sizes may be used. The filter may be made of, but not limited to, polyethylene, polypropylene, fluororesin, or nylon.

Impurities such as particulate matter can be removed from the adhesion layer composition by such filtration. Thus, unexpected defects can be prevented which particulate matter or other impurities may cause in the adhesion layer after the adhesion layer composition has been applied.

If the adhesion layer composition of the present embodiment is used for manufacturing a semiconductor integrated circuit, it is desirable to avoid the contamination with metallic impurities containing a metal atom as much as possible in order to prevent the metallic impurities from interfering with the operation of the product. In such a case, the concentration of metallic impurities in the adhesion layer composition is desirably 10 ppm or less, and more desirably 100 ppb or less.

Photocurable Composition

The photocurable composition used with the adhesion layer composition of the present embodiment typically contains a polymerizable compound (I)) and a photopolymerization initiator (E).

Polymerizable Compound (D) 1

The polymerizable compound (D) reacts with a polymerizing factor such as radicals produced from the photopolymerization initiator (E), thus forming a polymer film by chain reaction (polymerization reaction).

The polymerizable compound (D) may be a single polymerizable compound or a combination of a plurality of polymerizable compounds.

The polymerizable compound (D) may be a radically polymerizable compound. The radically polymerizable compound may have at least one acryloyl group or methacryloyl group, and hence may be a (meth)acrylic compound.

Accordingly, it is advantageous that the polymerizable compound (D) contain a (meth)acrylic compound, and it is more advantageous that the (meth)acrylic compound be the main constituent of the polymerizable compound. Optimally, the polymerizable compound is a (meth)acrylic compound. When a (meth)acrylic compound is the main constituent of the polymerizable compound (D), the content of the (meth)acrylic compound is 90% by weight or more.

If the radically polymerizable compound is a combination of a plurality of compounds each having at least one acryloyl group or methacryloyl group, it is advantageous that radically polymerizable compound contain a monofunctional (meth)acrylate monomer and a polyfunctional (meth)acrylate monomer. By combining a monofunctional (meth)acrylate monomer and a polyfunctional (meth)acrylate monomer, a strong cured film can be formed.

Examples of the monofunctional (meth)acrylic compound having an acryloyl or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol (meth)acrylate, ethoxyahyl (meth)acrylate, methoxypolyethylene glycol (meth)acrylate, methoxypolypropylene glycol (meth)acrylate, diacetone (meth)acrylamid, isobutoxymethyl(meth)acrylamide, N,N-dimethyl(meth)acrylamide, t-octyl(meth)acrylarnide, dimethylaminoethyl (meth)acrylate, diethylaminoethyl (meth)acrylate, 7-amino-3,7-dimethyloctyl (meth)acrylate, N,N-diethyl(meth)acrylamide, and N,N-dimethylaminopropyl (meth)acrylamide.

Some monofunctional (meth)acrylic compounds are commercially available, and examples thereof include, but are not limited to, Aronix series M101, M102, M110, M111, M113, M117, M5700, TO-1317, M120, M150 and M156 (each produced by Toagosei); MEDOL 10, MIBDOL 10, CHDOL 10, MMDOL 30, MEDOL 30, MIBDOL 30, CHDOL 30, LA, IBXA, 2-MTA, HPA, and Biscoat series #150, #155, #158, #190, #192, #193, #220, #2000, #2100 and #2150 (each produced by Osaka Organic Chemical Industry); Light Acrylates BO-A, EC-A, DMP-A, THF-A, HOP-A, HOA-MPE, HOA-MPL, PO-A, P-200A, NP-4EA and NP-BEA, and epoxy ester M-600A (each produced by Kyoeisha Chemical); KAYARAD TC110S, R-564 and R-128H (each produced by Nippon Kayaku); NK esters AMP-10G and AMP-20G (each produced by Shin-Nakamura. Chemical); FA-511A, 512A and 513A (each produced by Hitachi Chemical); PHE, CEA, PHE-2, PHE-4, BR-31, BR-31M and BR-32 (each produced by Dai-ichi Kogyo Seiyaku); VP (produced by BASF); and ACMO, DMAA and DMAPAA (each produced by Kohjin).

Examples of the polyfunctional (meth)acrylic compound having two or more acryloyl or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO, PO-modified trimethylolpropane tri(meth)acrylate, dimethyloltricyclodecane diacrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,3-adamantanedimethanol diacrylate, 1,9-nonanediol diacrylate, 1,10-decanediol diacrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO, PO-modified 2,2-bis(4-((meth)acryloxy)phenyl)propane.

Some polyfunctional (meth)acrylic compounds are commercially available, and examples thereof include, but are not limited to, Yupimer UV SA1002 and Yupimer UV SA2007 (each produced by Mitsubishi Chemical); Biscoat series #195, #230, #215, #260, #335HP, #295, #300, #360, #700, GPT and 3PA (each produced by Osaka Organic Chemical Industry); Light Acrylates 4EG-A, 9EG-A, NP-A, DCP-A, BP-4EA, BP-4PA, TMP-A, PE-3A, PE-4A and DPE-6A (each produce by Kyoeisha Chemical); A-DCP, A-HD-N, A-NOD-N and A-DOD-N (each produced by Shin-Nakamura Chemical); KAYARAD PET-30, TMPTA, R-604, DPHA, DPCA-20, -30, -60 and -120, HX-620, D-310, and D-330 (each produced by Nippon Kayaku); Aronix series M208, M210, M215, M220, M240, M305, M309, M310, M315, M325 and M400 (each produced by Toagosei); and Ripoxy VR-77, Ripoxy VR-60 and Ripoxy VR-90 (each produced by Showa Denko).

In the above-cited compounds, (meth)acrylate refers to an acrylate or the methacrylate containing the same alcohol residue as the acrylate. Also, a (meth)acryloyl group refers to an acryloyl group or the methacryloyl group containing the same alcohol residue as the acryloyl group. EO represents ethylene oxide, and EO-modified compound A is a compound in which the (meth)acrylic acid residue and alcohol residue of compound A are bound to each other with an ethylene oxide block structure therebetween. PO represents propylene oxide, and PO-modified compound B is a compound in which the (meth)acrylic acid residue and alcohol residue of compound B are bound to each other with a propylene oxide block structure therebetween.

Photopolymerization Initiator (E) 1

The photopolymerization initiator (E) senses light having a specific wavelength to produce a polymerizing factor (radicals). More specifically, the photopolymerization initiator is a polymerization initiator (radical generator) that produces radicals with light (radiations, such as infrared radiation, visible light radiation, ultraviolet radiation, far ultraviolet radiation, X-ray radiation, and electron beams and other charged particle radiation). For example, the photopolymerization initiator produces radicals with light having a wavelength in the range of 150 nm to 400 nm.

The photopolymerization initiator (E) may be a single photopolymerization or a combination of a plurality of photopolymerization initiators.

Exemplary radical generators include, but are not limited to, substituted or unsubstituted 2,4,5-triarylimidazole dimers, such as 2-(o-chlorophenyl)-4,5-diphenylimidazole dimer, 2-(o-chlorophenyl)-4,5-di(methoxyphenyl)imidazole diner, 2-(o-fluorophenyl)-4,5-diphenylimidazole dimer, and 2-(o- or p-methoxyphenyl)-4,5-diphenylimidazole dimer; benzophenone and benzophenone derivatives, such as N,N'-tetramethyl-4,4'-diaminobenzophenone (Michler's ketone), N,N'-tetraethyl-4,4'-diaminobenzophenone 4-methoxy-4'-dimethylaminobenzophenone, 4-chlorobenzophenone, 4,4'-dimethoxybenzophenone, and 4,4'-diaminobenzophenone; α-aminoaromatic ketone derivatives, such as 2-benzyl-2-dimethylamino-1-(4-morpholinophenyl)-butanone-1 and 2-methyl-1-[4-(methylthio)phenyl]-2-morpholino-propane- 1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, 2,3-dimethylanthraquinone; benzoin ether derivatives, such as benzoin methyl ether, benzoin ethyl ether, and benzoin phenyl ether; benzoin derivatives, such as benzoin, methylbenzoin, ethylbenzoin, and propylbenzoin; benzyl derivatives such as benzyl dimethyl ketal; acridine derivatives, such as 9-phenylacridine and 1,7-bis(9,9'-acridinyl) heptane; N-phenylglycine and N-phenylglycine derivatives; acetophenone and acetophenone derivatives, such as 3-methylacetophenone, acetophenone benzyl ketal, 1-hydroxycyclohexyl phenyl ketone, and 2,2-dimethoxy-2-phenylacetophenone; thioxanthone and thioxanthene derivatives, such as diethylthioxanthone, 2-isopropylthioxanthone, and 2-chlorothioxanthone; acylphosphine oxide derivatives, such as 2,4,6-trimethylbenzoyldiphenylphosphine oxide, bis (2,4,6-trimethylbenzoyl)phenylphosphine oxide, and bis-(2,6-dimethoxybenzoyl)-2,4,4-trimethylpentylphosphine oxide; oxime ester derivatives, such as 1,2-octanedione, 1-[4-(phenylthio)-2-(O-benzoyloxime)], ethanone-1-[9-ethyl-6-(2-methylbenzoyl)-9H-carbazole-3-yl]-1-(O-acetyloxime); and xanthone, fluorenone, benzaldehyde, fthorene, anthraquinone, triphenylamine, carbazole, 1-(4-isopropylphenyl)-2-hydroxy-2-methylpropane-1-one, and 2-hydroxy-2-methyl-1-phenylpropane-1-one.

The radical generator may be commercially available, and examples thereof include, but are not limited to, Irgacure series 184, 369, 651, 500, 819, 907, 784 and 2959, CGI-1700, -1750 and -1850, CG24-61, Darocur series 1116 and 1173, Lucirin TPO, LR 8893, and LR 8970 (each produced by BASF); and Ubecryl P36 (produced by UCB).

The proportion of the photopolymerization initiator (E) to the total weight of the polymerizable compound (D) is in the range of 0.01% to 10% by weight, and is desirably in the range of 0.1% to 7% by weight.

When the proportion of the photopolymerization initiator (E) to the total weight of the polymerizable compound (D) is 0.01% by weight or more, the photocurable composition can be prevented from being degraded in curing rate, and accordingly, the decrease of reaction efficiency can be prevented. When the proportion of the photopolymerization initiator (E) to the total weight of the polymerizable compound (D) is 10.0% by weight or less, the cured film of the photocurable composition can be prevented from being degraded in mechanical properties.

Other Additives (F) 1

The photocurable composition used with the adhesion layer composition may further contain other additives (F) according to the use thereof within a range in which the intended effects of the present invention are produced, in addition to polymerizable compound (D) and photopolymerization initiator (E). Such additives include a sensitizer, a hydrogen donor, an internal releasing agent, a surfactant, an antioxidant, a solvent, a polymer component, and a polymerization initiator other than the photopolymerization initiator (E).

The sensitizer is optionally added to promote the polymerization reaction or increase reaction conversion rate. The sensitizer may be a sensitizing dye.

The sensitizing dye is a compound that is excited by absorbing light having a specific wavelength and interacts with the photopolymerization initiator (E). The phrase "interacts with" implies that, for example, energy or electrons transfer from the excited sensitizing dye to the photopolymerization initiator (E).

Examples of the sensitizing dye include, but are not limited to, anthracene derivatives, anthraquinone derivatives, pyrene derivatives, perylene derivatives, carbazole derivatives, benzophenone derivatives, thioxanthene derivatives, xanthene derivatives, coumarin derivatives, phenothiazine derivatives, camphorquinone derivatives, acridine dyes, thiopyrylium salt-based dyes, merocyanine dyes, quinoline dyes, styryl quinoline dyes, ketocoumarin dyes, thioxanthene dyes, xanthene dyes, oxonol dyes, cyanine dyes, rhodamine dyes, and pyrylium salt-based dyes.

These sensitizing dyes may be used singly or in combination.

The hydrogen donor is a compound that can react with an initiator radical generated from the photopolymerization initiator (E) or a chain end radical to produce a more reactive radical. It is advantageous that the hydrogen donor be added when the photopolymerization initiator (E) is a photoradical generator.

Examples of the hydrogen donor include, but are not limited to, amine compounds, such as n-butylamine, di-n-butylamine, tri-n-butylphosphine, allylthiourea, s-benzylisothiuronium-p-toluene sulfonate, triethylamine, diethylaminoethyl methacrylate, triethylenetetramine, 4,4'-bis (dialkylamino)benzophenone, N,N-dimethylaminobenzoic acid ethyl ester, N,N-dimethylaminobenzoic acid isoamyl ester, pentyl 4-(dimethylamino)benzoate, triethanolamine, and N-phenylglycine; and mercapto compounds, such as 2-mercapto-N-phenylbenzoimidazole and mercapto-propionic acid ester.

These hydrogen donors may be used singly or in combination.

The hydrogen donor may have a function as a sensitizer.

When the photocurable composition used with the adhesion layer composition of the present embodiment contains a sensitizer or a hydrogen donor as other additives (F), the proportion of each of the additives may be in the range of 0.1% to 20% by weight, such as 0.1% to 5.0% by weight, relative to the total weight of the polymerizable compound (D), and is desirably in the range of 0.2% to 2.0% by weight. When the proportion of the sensitizer is 0.1% by weight or more relative to the total weight of the polymerizable compound (D), polymerization can be promoted more effectively. Also, by controlling the proportion of the sensitizer or the hydrogen donor to 5.0% by weight or less, the photocurable composition can be cured into a polymer film having a sufficiently large molecular weight. Also, such an amount of sensitizer or hydrogen donor is unlikely to fail to dissolve, and the photocurable composition can be prevented from being degraded in storage stability.

An internal releasing agent may be added to the photocurable composition in order to reduce the interfacial bonding strength between a mold and a resist, that is, the force for removing the mold. The internal releasing agent mentioned herein is a releasing agent that has been added to the photocurable composition before applying or placing the photocurable composition.

The internal releasing agent may be a silicone surfactant, a fluorosurfactant, or a hydrocarbon surfactant. In the present embodiment, the internal releasing agent is not polymerizable.

The fluorosurfactant may be a polyalkylene oxide (such as polyethylene oxide or polypropylene oxide) adduct of an alcohol having a perfluoroalkyl group, or a polyalkylene oxide (such as polyethylene oxide or polypropylene oxide) adduct of perfluoropolyether. The fluorosurfactant may have a hydroxy, alkoxy, alkyl, amino or thiol group or the like in a part (for example, a terminal group) of the molecule.

The fluorosurfactant may be a commercially available product. Examples of the commercially available fluorosurfactant include Megafac series F-444, TF-2066, TF-2067 and TF-2068 (each produced by DIC); Fluorad series FC-430 and FC-431 (each produced by Sumitomo 3M); Surflon S-382 (produced by AGC); EFTOP EF-122A, 122B, 1220, EF-121, EF-126, EF-127 and MF-100 (each produced by Tochem Products); PF-636, PF-6320, PF-656 and PF-6520 (each produced by OMNOVA Solutions); Unidyne series DS-401, DS-403 and DS-451 (each produced by Daikin Industries); and Ftergent series 250, 251, 222F and 208G (each produced by Neos)

The internal releasing agent may be a hydrocarbon surfactant.

The hydrocarbon surfactant may be an alkyl alcohol polyalkylene oxide adduct produced by adding an alkylene oxide having a carbon number of 2 to 4 to an alkyl alcohol having a carbon number of 1 to 50.

Examples of the alkyl alcohol polyalkylene oxide adduct include methyl alcohol ethylene oxide adduct, decyl alcohol ethylene oxide adduct, lauryl alcohol ethylene oxide adduct, cetyl alcohol ethylene oxide adduct, stearyl alcohol ethylene oxide adduct, and stearyl alcohol ethylene oxide/propylene oxide adduct. The terminal group of the alkyl alcohol polyalkylene oxide adduct is not limited to the hydroxy group, which is formed when a polyalkylene oxide is simply added to an alkyl alcohol. The hydroxy group may be substituted with a polar functional group, such as carboxy, amino, pyridyl, thiol, or silanol, or a hydrophobic functional group, such as alkyl or alkoxy.

A commercially available alkyl alcohol polyalkylene oxide adduct may be used. Examples thereof include polyoxyethylene methyl ethers (methyl alcohol polyethylene oxide adducts) BLAUNON series MP-400, MP-550 and MP-1000 (each produced by Aoki Oil Industrial); polyoxyethylene decyl ethers (decyl alcohol polyethylene oxide adducts) FINESURF series D-1303, D-1305, D-1307 and D-1310 (each produced by Aoki Oil Industrial); polyoxyethylene lauryl ether (lauryl alcohol polyethylene oxide adduct) BLAUNON EL-1505 (produced BY Aoki Oil industrial); polyoxyethylene cetyl ethers (cetyl alcohol polyethylene oxide adducts) BLA UNON series CH-305 and CH-310 (each produced by Aoki Oil Industrial); polyoxyethylene stearyl ethers (stearyl alcohol polyethylene oxide adducts) BLAUNON series SR-705, SR-707, SR-715, SR-720, SR-730 and SR-750 (each produced by Aoki Oil Industrial); random copolymer type polyoxyethylene/polyoxypropylene stearyl ethers BLAUNON series SA-50/50 1000R and SA-30/70 2000R (each produced by Aoki Oil Industrial); polyoxyethylene methyl ether Pluriol A760E (produced by BASF); and polyoxyethylene alkyl ethers EMULGEN series (produced by Kao).

Among the above-cited hydrocarbon surfactants, alkyl alcohol polyalkylene oxide adducts, particularly, long chain alkyl alcohol polyalkylene oxide adducts are suitable as the internal mold agent.

Internal mold releasing agents may be used singly or in combination.

When the photocurable composition used with the adhesion layer composition of the present embodiment contains an internal releasing agent as one of the additives (F), the proportion of the internal releasing agent may be in the range of 0.001% to 10% by weight relative to the total weight of the polymerizable compound (D). Desirably, it is in the range of 0.01% to 7% by weight, and more desirably in the range of 0.05% to 5% by weight.

When the proportion of the internal releasing agent is at least in the range of 0.001% to 10% by weight, the mold can be easily removed, and the photocurable composition can fill the mold satisfactorily.

Temperature for Preparing Photocurable Composition

For preparing the photocurable composition used with the adhesion layer composition of the present embodiment, the polymerizable compound (D) and the photopolymerization initiator (E) are mixed and dissolved in each other at a temperature in the range of 0° C. to 100° C. The same applies to the case of containing other additives (F).

Viscosity of Photocurable Composition

The mixture of the constituents other than the solvent of the photocurable composition used with the adhesion layer composition of the present embodiment has a viscosity at 23° C. desirably in the range of 1 mPa·s to 100 mPa·s, more desirably in the range of 1 mPa·s to 50 mPa·s, such as in the range of 1 mPa·s to 20 mPa·s.

The photocurable composition having a viscosity of 100 mPa·s or less can fill the recesses of the fine pattern in the mold without taking a long time. Also, filling failure is unlikely to occur which causes a defect in the resulting pattern.

The photocurable composition having a viscosity of 1 mPa·s or more is more likely to be applied uniformly on the substrate, and does not easily flow out of the mold.

Surface Tension of Photocurable Composition

The mixture of the constituents other than the solvent of the photocurable composition used with the adhesion layer composition of the present embodiment has a surface tension at 23° C. desirably in the range of 5 mN/m to 70 mN/m, more desirably in the range of 7 mN/m to 35 mN/m, such as in the range of 10 mN/m to 32 mN/m. The photocurable composition having a surface tension of 5 mN/m or more can fill the recesses of the fine pattern in the mold without taking a long time.

Also, the photocurable composition having a surface tension of 70 mN/m or less can form a photo-cured film having a smooth surface.

Impurities in Photocurable Composition

As with the adhesion layer composition, the photocurable composition used with the adhesion layer composition desirably contains as little impurities as possible.

It is therefore desirable that the photocurable composition have been purified as with the adhesion layer composition. For example, the photocurable composition may be filtered for purification.

In this instance, more specifically, the mixture of the polymerizable compound (D) and the photopolymerization initiator (E) and, optionally, other additives (F) may be filtered through a filter having a pore size in the range of 0.001 µm to 5.0 µm. This filtration may be performed in a plurality of steps or repeated several times. The filtrate may be further filtered. A plurality of filters having different pore sizes may be used. The filter may be made of, but not limited to, polyethylene, polypropylene, fluororesin, or nylon.

Impurities such as particulate matter can be removed from the photocurable composition by such filtration. Thus, unexpected defects can be prevented which result from unevenness caused by particulate matter or other impurities in the photo-cured film formed by photo-curing the photocurable composition.

If the photocurable composition is used with the adhesion layer composition of the present embodiment for manufacturing a semiconductor integrated circuit, it is desirable to avoid the contamination with metallic impurities containing a metal atom as much as possible in order to prevent the metallic impurities from interfering with the operation of the product, as in the case of the adhesion layer composition. In this instance, the concentration of metallic impurities in the photocurable composition is desirably 10 ppm or less, and more desirably 100 ppb or less.

A method for forming a patterned film according to an embodiment of the present invention will now be described.

FIGS. 1A to 1H are schematic sectional views illustrating a method for forming a photo-cured product pattern according to an embodiment of the present invention.

The method includes:

(1) adhesion layer forming step of forming an adhesion layer by applying the adhesion layer composition of an embodiment of the present invention onto a substrate;

(2) application step of applying the above-described photocurable composition to the substrate;

(3) mold contact step of bringing the photocurable composition into contact with a mold;

(4) alignment step of aligning the mold with the substrate;

(5) irradiation step of irradiating the photocurable composition with light to form a photo-cured film; and (6) mold-releasing step of removing the mold from the photo-cured film.

This method for forming a photo-cured product pattern incorporates an imprinting technique, more specifically, a photo-nanoimprinting method.

The pattern formed in the photo-cured film by the method of an embodiment of the present invention may measure in the range of 1 nm to 10 mm, such as 10 nm to 100 μm. In general, methods for forming nanometer scale (1 nm to 100 nm) patterns (having recesses and projections) using light is called photo-nanoimprinting method, and the method for forming a photo-cured product pattern of the present invention incorporates the photo-nanoimprinting method.

The process steps of the method will now be described.

Adhesion Layer Forming Step (1)

In this step (adhesion layer forming step), an adhesion layer 101 is formed, as shown in FIG. 1A, by applying the above-described adhesion layer composition onto a substrate 102.

The substrate 102, or processing substrate, to which a photocurable composition 103 will be applied, is typically silicon wafer. For forming an imprint mold, a quartz substrate may be used as the substrate 102. In this instance, the quartz substrate as the substrate 102 may be provided with a metal compound layer (hard mask material layer) thereon. Because of the presence of silanol groups at the surface of the silicon wafer, the surface of silicon wafer is likely to react with the hydroxy, carboxy, thiol, amino, epoxy, or (blocked) isocyanate group of the compound (A) when being heated.

The substrate 102 used in the present invention is however not limited to silicon wafer, and may be a substrate used for semiconductor devices, such as a substrate made of aluminum, titanium-tungsten alloy, aluminum-silicon alloy, aluminum-copper-silicon alloy, silicon oxide, or silicon nitride. Alternatively, it may be a substrate on which is formed one or more films, such as a spin-on-glass film, an organic film, a metal film, an oxide film, and a nitride film.

The adhesion layer composition may be applied onto the substrate by, for example, an ink jet method, dip coating, air knife coating, curtain coating, a wire barcode method, gravure coating, extrusion coating, spin coating, or a slit scan method. From the viewpoint of easy application, particularly of forming a uniform thickness, spin coating is suitable.

After the application of the adhesion layer composition, it may be advantageous that the compound (A) is allowed to react with the substrate to form chemical bonds while solvent (B) is removed. This operation can be performed by heating. Heating temperature can be appropriately set depending on the reactivity between the compound (A) and the substrate and the boiling points of the compound (A) and the solvent (B), and may be in the range of 70° C. to 250° C. Desirably, the heating temperature is in the range of 100° C. to 220° C., such as 140° C. to 220° C. The removal of the solvent (B) and the reaction between the substrate and the compound (A) may be performed at different temperatures.

The thickness of the adhesion layer 101 formed by applying the adhesion layer composition onto the substrate depends on use, and may be, for example, in the range of 0.1 nm to 100 nm. Desirably, it is in the range of 0.5 nm to 60 nm, such as 1 nm to 10 nm.

For forming the adhesion layer 101, the application of the adhesion layer composition may be repeated several times. Desirably, the resulting adhesion layer 101 is as flat as possible. The surface roughness of the adhesion layer is desirably 1 nm or less.

Application Step (2)

In this step (application step), the photocurable composition 103 used with the adhesion layer composition is applied (placed) on the substrate 102, as shown in FIG. 1B.

The photocurable composition may be applied onto the substrate by, for example, an ink jet method, dip coating, air knife coating, curtain coating, a wire barcode method, gravure coating, extrusion coating, spin coating, or a slit scan method. In a photo-nanoimprinting method, an ink jet method is particularly suitable. The thickness of the applied photocurable composition (to which a pattern will be transferred) depends on use, and may be, for example, in the range of 0.01 μm to 100.0 μm.

Mold Contact Step (3)

Subsequently, the photocurable composition 103 applied in the preceding application step is brought into contact with a mold 104 having an original pattern to be transferred into an intended pattern, as shown in FIG. 1C. By bringing the photocurable composition 103 (to which a pattern will be transferred) into contact with the mold 104 (FIG. 1C (c-1)), the recesses of the fine pattern of the mold 104 is filled with the photocurable composition 103, thus forming a coating film 105 filling the fine pattern of the mold 104 (FIG. 1C (c-2)).

The mold 104 is made of an optically transparent material in view of the subsequent irradiation step. For example, the mold 104 may be made of glass, quartz, an optically transparent resin, such as polymethyl methacrylate (PMMA) or polycarbonate, a transparent metal film formed by vapor deposition, a soft film of polydimethylsiloxane or the like, a photo-cured film, or a metal film. If an optically transparent resin is used as the material of the mold 104, the optically transparent resin is a material insoluble in any constituent of the photocurable composition 103. Quartz is most suitable because it has a small thermal expansion coefficient and is accordingly unlikely to deform the pattern in the mold.

The fine pattern in the surface of the mold 104 may have a height in the range of 4 nm to 200 nm and each portion of the pattern may have an aspect ratio in the range of 1 to 10.

The mold 104 may be surface-treated before the mold contact step so that the mold 104 can be easily removed from the photocurable composition 103. For the surface treatment, a mold releasing agent may be applied to the surface of the mold. Examples of the mold releasing agent to be applied to the surface of the mold include silicone releasing agents, fluorine-based releasing agents, hydrocarbon releasing agents, polyethylene-based releasing agents, polypropylene-based releasing agents, paraffin releasing agents, montanic releasing agents, and carnauba releasing agents. Commercially available mold releasing agents that are the type of being applied, such as Optool DSX produced by Daikin Industries, can be advantageously used. Mold releasing agents may be used singly or in combination. Fluorine-based and hydrocarbon releasing agents are particularly suitable.

When the photocurable composition 103 is brought into contact with the mold 104 as shown in FIG. 1C (c-1), the pressure applied to the photocurable composition 103 is typically, but not limited to, in the range of 0 MPa to 100 MPa. The pressure is desirably in the range of 0 MPa to 50 MPa, and more desirably in the range of 0 MPa to 30 MPa, such as 0 MPa to 20 MPa.

The mold 104 is kept in contact with the photocurable composition 103 for a period in the range of typically 0.1 s to 600 s, preferably in the range of 0.1 s to 300 seconds, and more preferably in the range of 0.1 s to 180 s, such as 0.1 s to 120 s.

Although the mold contact step may be performed in any atmosphere, such as an atmosphere of air, a reduced pressure or an inert gas, it is advantageous that the mold contact step is performed in an atmosphere of reduced pressure or an inert gas, from the viewpoint of preventing oxygen or moisture from affecting the curing reaction. Inert gases that can be used in this step include nitrogen, carbon dioxide, helium, argon, chlorofluorocarbon gases, and mixtures of these gases. When the mold contact step is performed in an atmosphere of a specific gas, including the case of air, the pressure of the gas may be in the range of 0.0001 to 10 atmospheres.

The mold contact step may be performed in an atmosphere containing a condensable gas (hereinafter referred to as condensable gas atmosphere), The condensable gas mentioned herein is present in the atmosphere in the form of gas before the photocurable composition 103 (to which a pattern will be transferred) is brought into contact with the mold 104 in the mold contact step (FIG. 1C (c-1)) and is condensed into liquid by capillary force generated with a pressure applied to the photocurable composition 103 when the photocurable composition is brought into contact with the mold 104 so that the resulting coating film 105 and the gas in the atmosphere fill the recesses of the fine pattern of the mold 104 and the gap between the mold and the substrate.

In the mold contact step performed in a condensable gas atmosphere, the gas having filled the recesses of the fine pattern is turned into liquid, thereby removing air bubbles. Consequently, the photocurable composition can satisfactorily fill the recesses of the mold. The condensable gas may be dissolved in the photocurable composition.

The boiling point of the condensable gas is lower than or equal to the temperature of the atmosphere, and may be in the range −10° C. to 23° C., such as 10° C. to 23° C. When the condensable gas has a boiling point in this range, the mold can be satisfactorily filled.

The vapor pressure of the condensable gas at the temperature of the atmosphere in the mold contact step is lower than or equal to the pressure the mold applies in the mold contact step and may be in the range of 0.1 MPa to 0.4 MPa. When the condensable gas has a vapor pressure in this range, the mold can be satisfactorily filled. If the vapor pressure is higher than 0.4 MPa at the temperature of the atmosphere, air bubbles are unlikely to be removed as expected. In contrast, if the vapor pressure is lower than 0.1 MPa at the temperature of the atmosphere, decompression is required. This requires a complicated apparatus.

The temperature of the atmosphere for the mold contact step may be, but is not limited to, in the range of 20° C. to 25° C.

Examples of the condensable gas include fluorocarbons (FCs) including chlorofluorocarbons (CFCs), such as trichlorofluoromethane; hydrofluorocarbons (HFCs) and hydrochlorofluorocarbons (HCFCs), such as 1,1,1,3,3-pentafluoropropane ($CHF_2CH_2CF_3$, HFC-245fa, PFP); and hydrofluoro ethers (HFEs), such as pentafluoroethyl methyl ether ($CF_3CF_2OCH_3$, HFE-245mc).

From the viewpoint of satisfactorily filling the mold at a temperature of 20° C. to 25° C. in the atmosphere in the mold contact step, advantageous are 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.) and pentafluoroethyl methyl ether. Particularly advantageous is 1,1,1,3,3-pentafluoropropane because of having high safety.

Condensable gases may be used singly or in combination. The condensable gas may be mixed with a non-condensable gas, such as air, nitrogen, carbon dioxide, helium, or argon. Helium is more suitable as the non-condensable gas to be mixed with the condensable gas from the viewpoint of satisfactorily filling the mold. When the gas (condensable gas and helium), together with the coating film 105, has filled the recesses of the fine pattern in the mold 104, helium can pass through the mold, while the condensable gas turns into liquid. Helium thus helps fill the mold satisfactorily.

Alignment Step (4)

In the subsequent step, at least either position of the mold or the processing substrate is adjusted so that alignment marks 106 on the mold and alignment marks 107 on the processing substrate are aligned with each other, as shown in FIG. 1D.

Irradiation Step (5)

Subsequently, the contact portion between the photocurable composition and the mold, or the coating film 105 filling the pattern in the mold 104, is irradiated with light through the mold 104 with the mold and the substrate aligned, as shown in FIG. 1E (e-1). Thus the portions of the coating film 105 filling the fine pattern of the mold 104 are cured into a photo-cured product 109 by light 108 (FIG. 1E (e-2)).

The light irradiating the photocurable composition 103 forming the coating film 105 filling the fine pattern of the mold is appropriately selected according to the wavelength to which the photocurable composition is sensitive, and examples of the light include ultraviolet light having a wavelength of 150 nm to 400 nm, X-ray radiation, and electron beams.

Among these, ultraviolet light is more suitable as the light irradiating the photocurable composition 103 (irradiation light 108). This is because many of the commercially available curing agents (photopolymerization initiators) are sensitive to ultraviolet light. Light sources that emit ultraviolet light include high-pressure mercury-vapor lamps, ultrahigh-pressure mercury-vapor lamps, low-pressure mercury-vapor lamps, Deep-UV lamps, carbon arc lamps, chemical lamps, metal halide lamps, xenon lamps, KrF excimer lasers, ArF excimer lasers, and F2 excimer lasers. An ultrahigh-pressure mercury-vapor lamp is advantageous.

The number of light sources may be one or more. The coating film 105 filling the fine pattern of the mold may be irradiated in part or entirety.

The irradiation may be performed over the entire region of the substrate intermittently several times or continuously. Alternatively, region A may be irradiated in a first stage of irradiation, and region B, different from region A, may be irradiated in a second stage of the irradiation.

In the irradiation step, the amount of exposure of the photocurable composition may be 90 mJ/cm$^2$ or less. Desirably, the amount of exposure is as low as 76 mJ/cm$^2$ or less, such as 30 mJ/cm$^2$ or less.

Mold-Releasing Step (6)

Subsequently, the mold 104 is removed from the photo-cured product 109. At this time, a photo-cured film 110 having a specific pattern has been formed on the substrate 102 as a photo-cured product pattern.

In the mold-releasing step, the photo-cured product 109 is separated from the mold 104, as shown in FIG. 1F, to yield a photo-cured film 110 having a pattern reverse to the fine pattern in the mold 104.

In the case of performing the mold contact step in a condensable gas atmosphere, the condensable gas evaporates as the pressure at the interface between the photo-cured product 109 and the mold 104 is reduced by removing the mold 104 from the photo-cured product 109. This helps remove the mold with a low force.

How to remove the mold 104 from the photo-cured product 109, including the conditions for mold releasing, is not particularly limited as long as the photo-cured product 109 is not physically damaged. For example, the mold 104 may be moved so as to go away from the processing substrate 102 fixed, or the substrate 102 may be moved so as to go away from the mold 104 fixed. Alternatively, the mold 104 and the substrate 102 may be drawn in the opposite directions so as to separate from each other.

The above-described process including the steps of (1) to (6) forms a photo-cured film having a desired relief pattern derived from the relief pattern in the mold 104 in a desired position. The resulting photo-cured film may be used as, for example, an optical member such as a Fresnel lens or a diffraction grating, or a member in the optical member. In this instance, the optical member includes at least the substrate 102 and the patterned photo-cured film 110 on the substrate 102.

In the method of the present embodiment, a repeating unit (shot) including the series of the steps (1) to (6) may be repeated several times for the same substrate. By repeating the repeating unit (shot) including the steps of (1) to (6) several times, a photo-cured film can be formed which has a desired pattern derived from the relief pattern of the mold 104 in a plurality of desired positions.

Unwanted Portion Removal Step (7) of Removing Part of Photo-Cured Film

The photo-cured film formed through Step (6) or the mold-releasing step has a specific pattern, and which may be present in a region other than the region in which the pattern should be formed (hereinafter such a portion of the photo-cured film may be referred to as an unwanted portion). In this case, the unwanted portion is removed together with the underlying adhesion layer so that the resulting photo-cured product pattern 111 can have a desired relief pattern (derived from the relief pattern in the mold 104).

In this step, the unwanted portion of the photo-cured film 110 can be removed by, for example, etching so as to expose the surface of the substrate 102 in the recesses of the pattern of the photo-cured film 110.

For removing unwanted portions in the recesses of the photo-cured film 110 and the underlying adhesion layer by etching, any technique may be applied without particular limitation, and a known technique, such as dry etching, may be performed. For the dry etching, a known dry etching apparatus can be used. The source gas used for the dry etching is appropriately selected according to the elemental composition of the cured film to be etched, and examples thereof include halogen-containing gases, such as $CF_4$, $C_2F_6$, $C_3F_8$, $CCl_2F_2$, $CCl_4$, $CBrF_3$, $BCl_3$, $PCl_3$, $SF_6$, and $Cl_2$; oxygen-containing gases, such as $O_2$, CO, and $CO_2$; inert gases, such as He, $N_2$, and Ar; and $H_2$ and $NH_3$. A mixed gas of these gases may be used.

In the above-described process including the steps of (1) to (7), the photo-cured product pattern 111 having a desired relief pattern (derived from the relief pattern in the mold 104) in a desired position is formed, and, thus, an article having the photo-cured product pattern is completed. If the substrate 102 is worked using the photo-cured product pattern 111, a working step (Step of (8)) is performed on the substrate as described below.

Alternatively, the photo-cured product pattern 111 may be, used in an optical component as an optical member (or a part of an optical member) such as a diffraction grating or a polarizer. In this instance, the optical component includes at least the substrate 102 and the photo-cured product pattern 111 on the substrate 102.

Substrate Working Step (8)

The photo-cured product pattern 111 having a relief pattern obtained by the method for forming a photo-cured product pattern of an embodiment of the present invention may be used as an interlayer insulating film of a semiconductor device, such as LSI, system LSI, DRAM, SDRAM, RDRAM, or D-RDRAM, or as a resist film used in a semiconductor manufacturing process.

If the photo-cured product pattern 111 is used as a resist film, portions (regions denoted by 112 in FIG. 1G) of the substrate that have been exposed by the step (7) of removing unwanted portions are subjected to etching or ion implantation. In this instance, the photo-cured product pattern 111 functions as an etching mask. In addition, the substrate 102 may be provided with electronic members. Thus, a circuit structure 113 (FIG. 1H) is formed on the substrate 102 according to the profile of the photo-cured product pattern 111. Thus, a circuit board used in a semiconductor device or the like is produced. The resulting circuit board may be connected to a control mechanism for the circuit board for producing an electronic component of a display, a camera, a medical apparatus, or any other apparatus.

Similarly, the photo-cured product pattern 111 may be used as a resist film for etching or ion implantation in a process for manufacturing an optical component or a device component, such as a flow channel structure of microfluidics and a patterned medium structure.

Alternatively, the photo-cured product pattern 111 may be used as a mask for etching a quarts substrate to produce an imprint mold 104 as a mold replica. In this instance, the substrate 102, or the quartz substrate, may be directly etched using the photo-cured product pattern 111 as a mask. A hard mask material layer on the quartz substrate may be etched using the photo-cured product pattern 111 as a mask, and then the quartz substrate is etched using the transferred pattern of the hard mask material as a mask. Alternatively, a second photo-cured product may be formed of a second curable composition in the recesses of the photo-cured product pattern 111, and the quartz substrate is etched using the second photo-cured product as a mask. Although, in the present embodiment, etching and ion implantation have been described as the method for etching the substrate 102 using the photo-cured product pattern 111 as a mask, the method is not limited to these. For example, plating may be performed on the substrate 102 provided with the photo-cured product pattern 111. In a process for manufacturing a circuit-including substrate or an electronic component, the photo-cured product pattern 111 may finally be removed from the substrate, or may be left as a member of a device.

EXAMPLES

The present invention will be further described in detail with reference to the following Examples. However, the invention is not limited to the disclosed Examples. In the following description, "part(s)" and "%" are on a weight basis unless otherwise specified.

Preparation of Adhesion Layer Composition

Each of the following compound (A) was mixed with a solvent (B), propylene glycol monomethyl acetate (produced by Tokyo Chemical Industry), to yield a mixed solution of 0.1% by weight of compound (A) in the solvent (B).

The resulting mixed solution was filtered through a polytetrafluoroethylene filter of 0.2 μm in pore size. Adhesion layer compositions 1 to 6 shown in Table 1 were thus prepared.

Compound (A) 2

(A-1): 1,3,5-Tris(3-mercaptobutyryloxyethyl)-1,3,5-triazine-2,4,6(1H,3H,5H)-trione, Karenz MT NR-1 (trade name) produced by Showa Denko (A-2): Trimethylolpropane tris(3-mercaptopropionate) (produced by Tokyo Chemical industry)

(A-3): Mixture of pentaerythritol tetrakis(3-mercaptobutylate) and pentaerythritol tris(3-mercapto butylate), Karenz MT PE-1 (trade name) produced by Showa Denko (A-4): Pentaerythritol tetrakis(3-mercaptopropionate) (produced by Tokyo Chemical industry)

(A-5): N-phenylglycine (produced by Tokyo Chemical Industry)

(A-6): N,N,N',N",N'''-pentakis(2-hydroxypropyl)diethylenetriamine (produced by Tokyo Chemical Industry)

(A-7): Trithiocyanuric acid (for comparison) (produced by Tokyo Chemical Industry)

(A-8): 6-(Dibutylamino)-1,3,5-triazine-2,4-dithiol (for comparison) (produced by Tokyo Chemical Industry)

TABLE 1

| Composition name | Compound (A) | Functional group bound to substrate | Functional group bound to photocurable composition |
|---|---|---|---|
| Adhesion layer composition1 | A-1 | Thiol | Thiol |
| Adhesion layer composition2 | A-2 | Thiol | Thiol |
| Adhesion layer comoosition3 | A-3 | Thiol/hydroxy | Thiol |
| Adhesion layer composition4 | A-4 | Thiol | Thiol |
| Adhesion layer composition5 | A-5 | Carboxy | Alkylamino |
| Adhesion layer composition6 | A-6 | Hydroxy | Alkylamino |
| Adhesion layer composition7 | A-7 | Thiol | Thiol |
| Adhesion layer composition8 | A-8 | Thiol | Alkylamino |

Preparation of Photocurable Composition

Mixed solutions were prepared by mixing the following polymerizable compound (D), photopolymerization initiator (E) and other additives (F) according to the proportions shown in Table 2. The numerals in Table 2 represent contents in terms of part(s) by weight.

Each of the resulting mixed solution was filtered through a polyethylene filter of 0.2 μm in pore size. Photocurable compositions 1 to 3 were thus prepared.

Polymerizable Compound (D) 2

(D-1): Isobornyl acrylate IB-XA (product name, produced by Kyoeisha Chemical)

(D-2): Benzyl acrylate V #160 (produce name, produced by Osaka Organic Chemical Industry)

(D-3): Neopentyl glycol diacrylate NP-A (product name, produced by Kyoeisha Chemical)

(D-4): Dimethyloltricyclodecane diacrylate, DCP-A (product name, produced by Kyoeisha Chemical)

Photopolymerization Initiator (E) 2

(E-1): Lucirin TPO (produced by BASF)

Other Additives (F) 2

(F-1): 4,4'-Bis(diethylamino)benzophenone (produced by Tokyo Chemical Industry)

(F-2): BLAUNON SR-730 (produced by Aoki Oil Industrial)

TABLE 2

(Numerals represents part(s) by weight

| | | Composition name | | |
|---|---|---|---|---|
| | | Photocurable composition 1 | Photocurable composition 2 | Photocurable composition 3 |
| Polymerizable compound (D) | D-1 | 9 | | |
| | D-2 | 38 | | 75 |
| | D-3 | 47 | 100 | |
| | D-4 | | | 25 |
| Photopolymerization initiator (E) | E-1 | 3 | 3 | 3 |
| Other additive (F) | F-1 | 0.5 | | |
| | F-2 | 1.6 | | |

Evaluation of Adhesion

Adhesion between the substrate and the photocurable composition was evaluated as below.

(1. Formation of Adhesion Layer)

Each of the prepared adhesion layer compositions 1 to 6 was applied onto silicon wafer by spin coating for 30 s at a rotation speed of 1500 rpm, followed by heating on a hot plate at 160° C. for 5 minutes. Thus adhesion layers of 1 nm or less in thickness were formed.

(2. Curing of Photocurable Composition)

Onto the silicon water having the adhesion layer thereon was dropped 2 μL of the prepared photocurable composition. Then, the photocurable composition was covered with 1 mm thick quartz glass, thereby filling a region of 35 mm×25 mm.

Subsequently, the sample was irradiated for 200 s through the quartz glass with light emitted from a UV light source with an ultrahigh-pressure mercury-vapor lamp and passed through an interference filter. The interference filter was VPF-25C-10-15-31300 (manufactured by Sigmakoki), and the ultraviolet light or irradiation light had a single wavelength of 313±5 nm and an illuminance of 1 mW/cm$^2$.

(3. Evaluation of Adhesion)

After the irradiation, the quartz glass was forcibly removed, and it was visually checked for separation of the photo-cured film. Samples exhibited no separation in the entire region of 35 mm×25 mm were judged good, and samples exhibited some separation in the region of 35 mm×25 mm were judged bad.

The results are shown collectively in Table 3.

TABLE 3

|  | Adhesion layer composition | Photocurable composition | Adhesion |
|---|---|---|---|
| Example 1 | Adhesion layer composition 1 | Photocurable composition 1 | Good |
| Example 2 | Adhesion layer composition 2 | Photocurable composition 1 | Good |
| Example 3 | Adhesion layer composition 3 | Photocurable composition 1 | Good |
| Example 4 | Adhesion layer composition 4 | Photocurable composition 1 | Good |
| Example 5 | Adhesion layer composition 5 | Photocurable composition 1 | Good |
| Example 6 | Adhesion layer composition 6 | Photocurable composition 1 | Good |
| Example 7 | Adhesion layer composition 5 | Photocurable composition 2 | Good |
| Example 8 | Adhesion layer composition 6 | Photocurable composition 2 | Good |
| Example 9 | Adhesion layer composition 3 | Photocurable composition 3 | Good |
| Example 10 | Adhesion layer composition 6 | Photocurable composition 3 | Good |
| Comparative Example 1 | None | Photocurable composition 1 | Bad |
| Comparative Example 2 | None | Photocurable composition 2 | Bad |
| Comparative Example 3 | None | Photocurable composition 3 | Bad |
| Comparative Example 4 | Adhesion layer composition 7 | Photocurable composition 1 | Bad |
| Comparative Example 5 | Adhesion layer composition 7 | Photocurable composition 2 | Bad |
| Comparative Example 6 | Adhesion layer composition 7 | Photocurable composition 3 | Bad |
| Comparative Example 7 | Adhesion layer composition 8 | Photocurable composition 1 | Bad |
| Comparative Example 8 | Adhesion layer composition 8 | Photocurable composition 2 | Bad |
| Comparative Example 9 | Adhesion layer composition 8 | Photocurable composition 3 | Bad |

The adhesion layers of Examples 1 to 10 exhibited good adhesion between the photocurable composition and the substrate without separation of the photo-cured film. On the other hand, in the samples of Comparative Examples 1 to 3 having no adhesion layer, separation of the photo-cured film was observed in the cases of using any of photocurable compositions 1 to 3. In the cases of using adhesion layer composition or 8 containing compound A-7 or A-8 as the compound (A), separation of the photocured film was observed in the cases of using any of photocurable compositions 1 to 3. This is probably because the heterocyclic rings of compounds A-7 and A-8, each containing nitrogen and an unsaturated bond, absorbed light, consequently reducing the adhesion. Accordingly, the use of the adhesion layer of an embodiment of the present invention is expected to be useful in providing a photo-cured article that is unlikely to cause the pattern to separate therefrom.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An adhesion layer composition for forming an adhesion layer between a substrate and a photocurable composition, the adhesion layer composition comprising:
 a compound (A) containing at least two binding functional groups including at least one functional group directly bound to a hydrocarbon or an aromatic hydrocarbon and capable of being bound to the substrate, and at least one functional group directly bound to a hydrocarbon or an aromatic hydrocarbon and capable of being bound to the photocurable composition; and
 a solvent (B),
 wherein the functional group capable of being bound to the substrate is at least one selected from the group consisting of hydroxy, carboxy, thiol, amino, epoxy, and (blocked) isocyanate, and the functional group capable of being bound to the photocurable composition is a hydrogen donating functional group, and
 wherein the hydrogen donating functional group is thiol or alkylamino.

2. The adhesion layer composition according to claim 1, wherein the compound (A) contains at least three hydrogen donating functional groups in the molecule thereof.

3. The adhesion layer according to claim 1, wherein the functional group capable of being bound to the substrate is at least one of hydroxy and thiol.

4. The adhesion layer composition according to claim 1, wherein the compound (A) has no heterocyclic structure.

5. The adhesion layer composition according to claim 1, wherein the compound (A) has straight chains extending in four directions, each end of which is bound to the functional group capable of being bound to the substrate or the functional group capable of being bound to the photocurable composition.

6. The adhesion layer composition according to claim 1, wherein the compound (A) contains at least four thiol groups in the molecule thereof.

7. The adhesion layer composition according to claim 1, wherein the compound (A) is at least one selected from the group consisting of 1,3,5-tris(3-mercaptobutyryloxyethyl)-1,3,5-triazine-2,4,6(1H,3H,5H)-trione, trimethylolpropane tris(3-mercaptopropionate), pentaerythritol tetrakis(3-mercaptobutylate), pentaerythritol tris(3-mercaptobutylate), pentaerythritol tetrakis(3-mercaptopropionate), N-phenylglycine, and N,N,N',N'',N''-pentakis(2-hydroxypropyl)diethylenetriamine.

8. The adhesion layer composition according to claim 1, wherein the solvent (B) is propylene glycol monomethyl ether acetate or contains propylene glycol monomethyl ether acetate.

9. The adhesion layer composition according to claim 1, wherein the photocurable composition contains a polymerizable compound and a photopolymerization initiator.

10. The adhesion layer composition according to claim 9, wherein the polymerizable compound is (meth)acrylate monomer.

11. A method for forming a photo-cured product pattern, comprising:
 forming an adhesion layer by applying the adhesion layer composition as set forth in claim 1 onto a substrate;
 applying a photocurable composition to the substrate having the adhesion layer;
 bringing the photocurable composition into contact with a mold having an original pattern to be transferred;

irradiating the photocurable composition with light to form a photo-cured product; and removing the mold from the photo-cured product.

12. The method according to claim 11, wherein the irradiating is performed using ultraviolet light.

13. The method according to claim 11, wherein the substrate has a hydroxy group at the surface thereof.

14. The method according to claim 11, wherein the mold is made of quartz.

15. A method for manufacturing an optical component, the method comprising:

forming a patterned film on a substrate by the method as set forth in claim 11.

16. A method for manufacturing an optical component, the method comprising:

forming a patterned film by the method as set forth in claim 11; and working the substrate by etching or ion implantation using the patterned film as a mask.

17. A method for manufacturing a circuit board, the method comprising:

forming a patterned film by the method as set forth in claim 11;

working the substrate by etching or ion implantation using the patterned film as a mask; and forming an electronic member.

18. The method according to claim 17, wherein the circuit board is a semiconductor element.

19. The method for forming a patterned film according to claim 11, wherein the bringing of the photocurable composition into contact is performed in an atmosphere containing a condensable gas.

20. A method for manufacturing an imprint mold, the method comprising:

forming a photo-cured product pattern on a substrate by the method as set claim 11; and etching the substrate using the photo-cured product pattern.

21. A device component comprising:

a substrate;

a photo-cured product made of a photocurable composition, having a relief pattern on the substrate; and an adhesion layer between the substrate and the photo-cured product, the adhesion layer containing a compound (A) containing at least two binding functional groups including a functional group capable of being bound to the substrate and a functional group capable of being bound to the photocurable composition, wherein the functional group capable of being bound to the substrate is bound to a hydrocarbon and selected from the group consisting of hydroxy, carboxy and thiol, and the functional group capable of being bound to the photocurable composition is at least one hydrogen donating functional group bound to a hydrocarbon or an aromatic hydrocarbon, and wherein the hydrogen donating functional group is thiol or alkylamino.

* * * * *